(12) United States Patent
Kang et al.

(10) Patent No.: US 10,157,766 B2
(45) Date of Patent: Dec. 18, 2018

(54) METHOD OF FABRICATING A SEMICONDUCTOR DEVICE

(71) Applicants: Un-Byoung Kang, Hwaseong-si (KR); Joonsik Sohn, Yongin-si (KR); Jung-Seok Ahn, Seoul (KR); Chungsun Lee, Anyang-si (KR); Taeje Cho, Yongin-si (KR)

(72) Inventors: Un-Byoung Kang, Hwaseong-si (KR); Joonsik Sohn, Yongin-si (KR); Jung-Seok Ahn, Seoul (KR); Chungsun Lee, Anyang-si (KR); Taeje Cho, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/112,429

(22) PCT Filed: Mar. 19, 2014

(86) PCT No.: PCT/IB2014/005998
§ 371 (c)(1),
(2) Date: Jul. 19, 2016

(87) PCT Pub. No.: WO2015/140595
PCT Pub. Date: Sep. 24, 2015

(65) Prior Publication Data
US 2017/0004990 A1 Jan. 5, 2017

(51) Int. Cl.
*H01L 21/683* (2006.01)
*H01L 21/48* (2006.01)
(Continued)

(52) U.S. Cl.
CPC .......... *H01L 21/6836* (2013.01); *H01L 21/48* (2013.01); *H01L 21/4853* (2013.01);
(Continued)

(58) Field of Classification Search
CPC .......... H01L 21/2007; H01L 21/02013; H01L 21/78; H01L 21/7806; H01L 21/76879;
(Continued)

(56) References Cited

U.S. PATENT DOCUMENTS 7,226,812 B2  6/2007  Lu et al.
7,459,343 B2  12/2008  Yamano
(Continued)

FOREIGN PATENT DOCUMENTS

CN  101764047  6/2010
CN  102290367  12/2011
(Continued)

*Primary Examiner* — Thanh T Nguyen
(74) *Attorney, Agent, or Firm* — Muir Patent Law, PLLC

(57) ABSTRACT

Provided are methods of fabricating a semiconductor device. According to the method, a first glue layer, a first release layer, a second glue layer, and a second release layer may be sequentially interposed between a carrier and a device wafer. All of the first glue layer, the first release layer, the second glue layer, and the second release layer may be formed of thermosetting resin.

19 Claims, 23 Drawing Sheets

(51) Int. Cl.
*H01L 21/56* (2006.01)
*H01L 21/768* (2006.01)
*H01L 21/78* (2006.01)
*H01L 23/544* (2006.01)
*H01L 25/065* (2006.01)
*H01L 25/00* (2006.01)
*H01L 23/00* (2006.01)

(52) U.S. Cl.
CPC ............ *H01L 21/56* (2013.01); *H01L 21/561* (2013.01); *H01L 21/565* (2013.01); *H01L 21/568* (2013.01); *H01L 21/6835* (2013.01); *H01L 21/76898* (2013.01); *H01L 21/78* (2013.01); *H01L 23/544* (2013.01); *H01L 24/16* (2013.01); *H01L 24/92* (2013.01); *H01L 24/94* (2013.01); *H01L 24/97* (2013.01); *H01L 25/0657* (2013.01); *H01L 25/50* (2013.01); *H01L 21/563* (2013.01); *H01L 24/02* (2013.01); *H01L 24/03* (2013.01); *H01L 24/06* (2013.01); *H01L 24/13* (2013.01); *H01L 24/17* (2013.01); *H01L 24/29* (2013.01); *H01L 24/32* (2013.01); *H01L 2221/6834* (2013.01); *H01L 2221/68327* (2013.01); *H01L 2221/68381* (2013.01); *H01L 2223/5446* (2013.01); *H01L 2224/0239* (2013.01); *H01L 2224/03002* (2013.01); *H01L 2224/06181* (2013.01); *H01L 2224/13111* (2013.01); *H01L 2224/13116* (2013.01); *H01L 2224/13147* (2013.01); *H01L 2224/16146* (2013.01); *H01L 2224/16227* (2013.01); *H01L 2224/17181* (2013.01); *H01L 2224/2919* (2013.01); *H01L 2224/32145* (2013.01); *H01L 2224/73204* (2013.01); *H01L 2224/73253* (2013.01); *H01L 2224/73265* (2013.01); *H01L 2224/92* (2013.01); *H01L 2224/92125* (2013.01); *H01L 2224/94* (2013.01); *H01L 2224/97* (2013.01); *H01L 2225/06513* (2013.01); *H01L 2225/06544* (2013.01); *H01L 2225/06582* (2013.01); *H01L 2924/15311* (2013.01); *H01L 2924/18161* (2013.01)

(58) Field of Classification Search
CPC ......... H01L 21/76802; H01L 21/76843; H01L 21/76882; H01L 21/76883; H01L 23/5226; H01L 23/53238; H01L 23/5329; H01L 23/53209; H01L 23/528; H01L 22/34; H01L 21/6836; H01L 23/544; H01L 21/565; H01L 21/4853; H01L 25/50; H01L 25/0657; H01L 21/76898; H01L 21/561; H01L 21/568; H01L 24/16; H01L 21/6835; H01L 24/94; H01L 24/92; H01L 21/56; H01L 21/48; H01L 2225/06544; H01L 2223/5446; H01L 2225/06513; H01L 2225/06582; H01L 2221/68381; H01L 21/563; H01L 2221/6834; H01L 2221/68327; H01L 2224/2919; H01L 2224/17181; H01L 2224/32145; H01L 2224/73204; H01L 2224/73253; H01L 24/32; H01L 24/29; H01L 24/17; H01L 2224/16227; H01L 24/13; H01L 24/06; H01L 24/03; H01L 24/02; H01L 2224/03002; H01L 2224/16146; H01L 2224/97; H01L 2924/15311; H01L 2224/13147; H01L 2224/13116; H01L 2224/13111; H01L 2924/18161; H01L 2224/06181; H01L 2224/0239; H01L 2224/73265

See application file for complete search history.

(56) References Cited

U.S. PATENT DOCUMENTS

| | | | |
|---|---|---|---|
| 8,298,365 | B2 | 10/2012 | Imai et al. |
| 2005/0160660 | A1 | 7/2005 | Frisch |
| 2010/0038035 | A1 | 2/2010 | Noda et al. |
| 2010/0041211 | A1* | 2/2010 | Noda .................. H01L 21/6835 438/464 |
| 2010/0043608 | A1 | 2/2010 | Jakob |
| 2010/0155936 | A1 | 6/2010 | Codding et al. |
| 2011/0209903 | A1 | 9/2011 | Uno et al. |
| 2011/0308739 | A1 | 12/2011 | McCutcheon et al. |
| 2012/0118511 | A1 | 5/2012 | Imai et al. |
| 2012/0329249 | A1* | 12/2012 | Ahn .................. H01L 21/78 438/464 |
| 2013/0192754 | A1 | 8/2013 | Dukkipati et al. |
| 2013/0201635 | A1 | 8/2013 | Xu |
| 2013/0213582 | A1 | 8/2013 | Inao et al. |
| 2014/0210075 | A1* | 7/2014 | Lee .................. H01L 21/6835 257/737 |
| 2014/0213039 | A1 | 7/2014 | Lee et al. |

FOREIGN PATENT DOCUMENTS

| | | |
|---|---|---|
| CN | 102420114 | 4/2012 |
| CN | 103367221 | 10/2013 |
| CN | 103426808 A | 12/2013 |
| CN | 103441093 A | 12/2013 |
| JP | 2011-100935 A | 5/2011 |
| JP | 2011-155065 A | 8/2011 |
| JP | 2013-012654 A | 1/2013 |
| KR | 10-2013-0046150 A | 5/2013 |
| KR | 10-2014-0001218 A | 1/2014 |

* cited by examiner

METHOD OF FABRICATING A SEMICONDUCTOR DEVICE

TECHNICAL FIELD

Example embodiments of the inventive concept relate to a method of fabricating a semiconductor device.

BACKGROUND ART

High performance, high speed, and small size electronic systems have been increasingly demanded with the development of the electronic industry. To meet the demand of small size, semiconductor chips become smaller and smaller. For example, a process of fabricating the semiconductor chip may include a back-grinding step of thinning a wafer. In the back-grinding step, a carrier for supporting the wafer may be attached to the wafer using an adhesive layer. During the back-grinding step, the carrier should not be detached from the wafer, and after the back-grinding step, the carrier should be easily detached from the wafer with preventing the wafer from being damaged.

DISCLOSURE

Technical Problem

Example embodiments of the inventive concept provide methods capable of reducing failure in a process of fabricating a semiconductor device.

Technical Solution

According to example embodiments of the inventive concept, a method of fabricating a semiconductor device may include sequentially forming a first glue layer and a first release layer on a first substrate, sequentially forming a second release layer and a second glue layer on a second substrate, and attaching the first substrate to the second substrate in such a way that the first release layer is in contact with the second glue layer.

In example embodiments, the method may further include forming an additional release layer on the first substrate, before the forming of the first glue layer and the first release layer.

In example embodiments, the method may further include performing a back-grinding process to reduce a thickness of the second substrate and forming a conductive pad on the second substrate.

In example embodiments, the method may further include cracking the first release layer to detach the first substrate from the second substrate.

In example embodiments, the method may further include sawing the second substrate to form semiconductor chips separated from each other.

In example embodiments, the method may further include mounting each of the semiconductor chips on a package substrate, forming a mold layer to cover the semiconductor chip, and attaching outer solder balls on a bottom surface of the package substrate.

In example embodiments, the method may further include mounting first semiconductor chips spaced apart from each other, on the second substrate, each of the first semiconductor chips being in contact with the conductive pad, forming a mold layer on the second substrate to cover the first semiconductor chips, cracking the first release layer to detach the first substrate from the second substrate, and performing a singulation process to cut the mold layer and a portion of the second substrate along regions between the first semiconductor chips, thereby forming semiconductor packages, each of which includes the first semiconductor chip, a second semiconductor chip provided below the first semiconductor chip, and a mold layer covering the first semiconductor chip.

In example embodiments, the method may further include performing a grinding process to remove a portion of the mold layer, before the detaching of the first substrate.

In example embodiments, the second substrate comprises a through via, and the back-grinding process is performed to expose the through via.

In example embodiments, the first and second glue layers and the first and second release layers are formed of thermosetting resins.

In example embodiments, the first and second release layers are formed to have a content of cross-linking agent that is lower than that of the first and second glue layers.

In example embodiments, the first and second glue layers and the first and second release layers are formed to have Young's moduli that are lower than those of the first and second substrates.

In example embodiments, the first glue layer is a thermoplastic resin layer, and the second glue layer and the first and second release layers are thermosetting resin layers.

In example embodiments, the second substrate further comprises a plurality of conductive bumps provided on a top surface thereof to be in contact with the second release layer.

In example embodiments, the first substrate is a carrier, and the second substrate is a device wafer with semiconductor devices.

In example embodiments, an adhesive strength between the first glue layer and the second glue layer is lower than adhesive strengths between the first glue layer and the first substrate and between the second glue layer and the second substrate.

According to example embodiments of the inventive concept, a method of fabricating a semiconductor device may include attaching a first substrate to a second substrate using a first glue layer, a first release layer, and a second glue layer that are sequentially interposed between the first and second substrates, and cracking the first release layer to detach the first substrate from the second substrate.

In example embodiments, the method may further include forming a second release layer between the second glue layer and the second substrate.

In example embodiments, the second substrate comprises chip parts and scribe lane parts therebetween, and the method further comprises cutting the scribe lane parts to separate the chip parts from each other.

Advantageous Effects

According to example embodiments of the inventive concept, in a fabricating method of a semiconductor device, all of glue and release layers interposed between a carrier and a device wafer may be formed of thermosetting resins, and thus, it is possible to prevent the glue and release layers from being mechanically deformed in several subsequent processes, such as a back-grinding process, a pad-forming process, and a mold process, for fabricating a semiconductor device. Accordingly, it is possible to maintain robustly an adhesive strength between the carrier and the device wafer. This makes it possible to suppress the process failure from occurring in the subsequent processes.

Further, according to the fabrication method, a first glue layer, a first release layer, and a second glue layer may be sequentially interposed between the carrier and the device wafer. Here, the glue and release layers may be configured to have Young's modulus smaller than those of the carrier and the device wafer. Accordingly, in the case where a physical force is applied to the first release layer, a plastic deformation may occur in a spatially uniform manner in the first release layer, and thus, a crack may be continuously propagated along the first release layer. Accordingly, the carrier and the device wafer can be easily detached from each other by the crack in the first release layer. In other words, it is possible to prevent the device wafer from being broken during the detaching process and thereby to increase a fabrication yield.

In addition, according to the fabrication method, since the second release layer is additionally interposed between the device wafer and the second glue layer, the second glue layer can be easily detached from the device wafer surface with preventing the device wafer from being damaged. In other words, it is possible to prevent the device wafer from being damaged during the detaching process and thereby to increase a fabrication yield.

BEST MODE

Figure 1A:
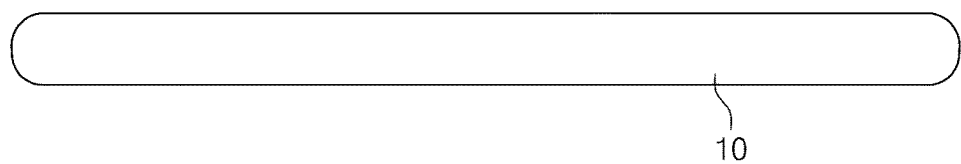
FIGS. 1A through 1Q are sectional views illustrating a method of fabricating a semiconductor device, according to example embodiments of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
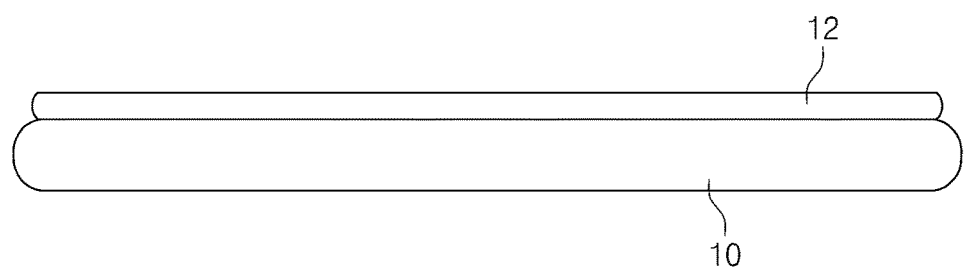
Figure 1C:
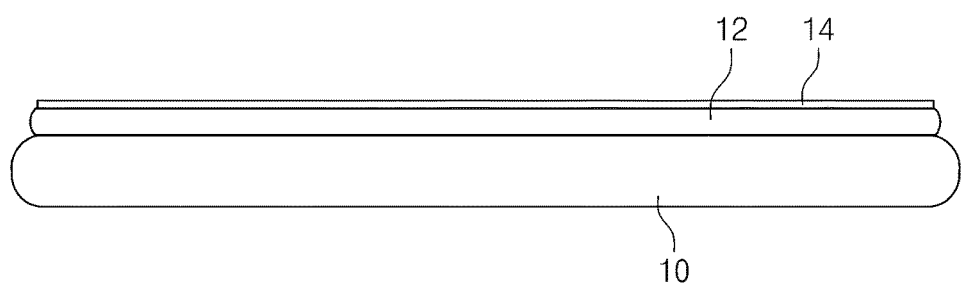
Figure 1D:
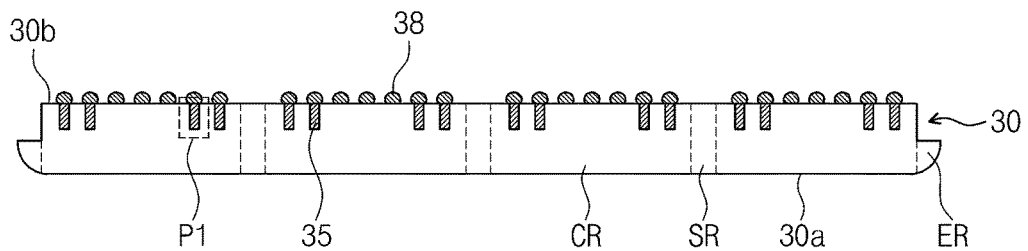
Figure 1E:
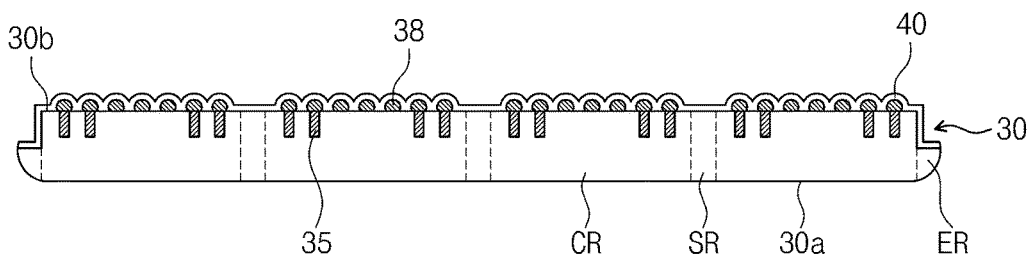
Figure 1F:
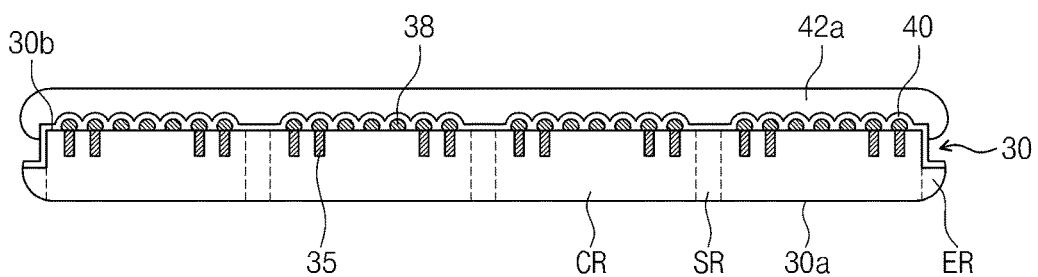
Figure 1G:
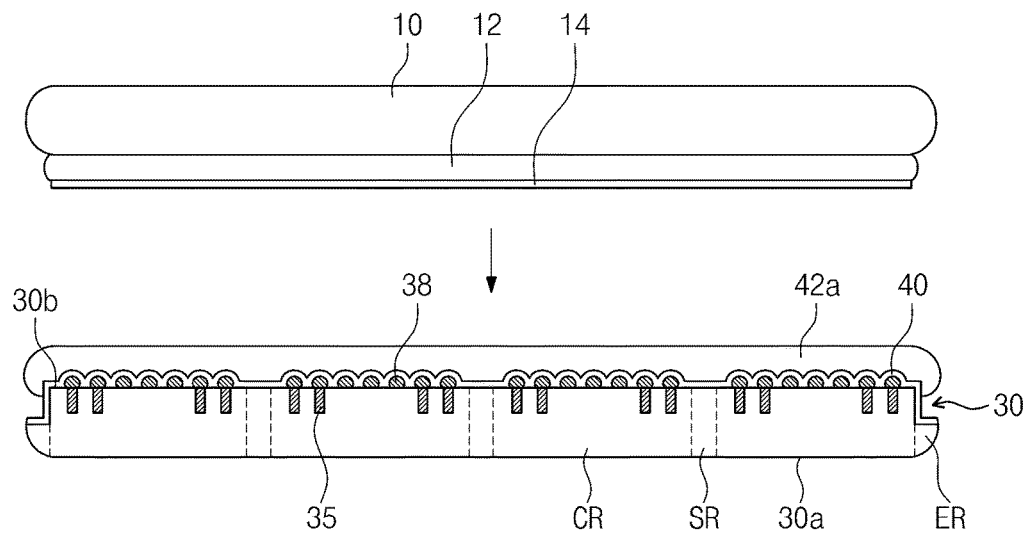
Figure 1H:
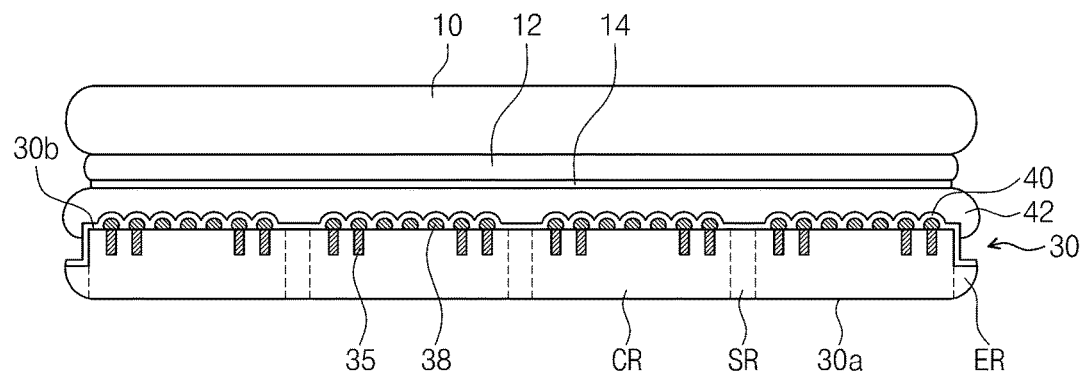
Figure 1I:
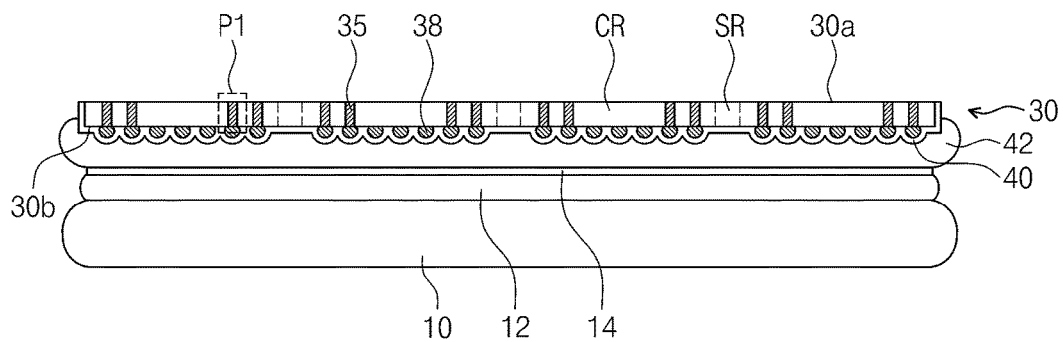
Figure 1J:
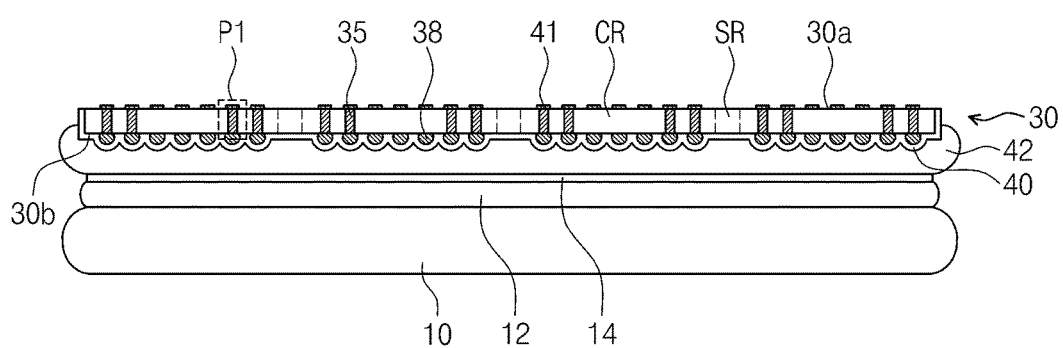
Figure 1K:
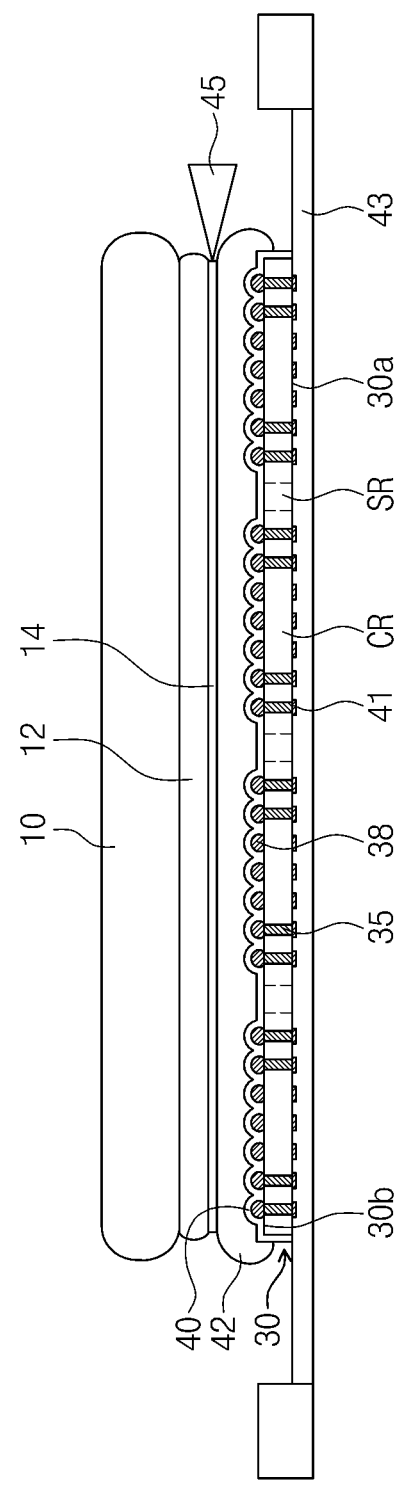
Figure 1L:
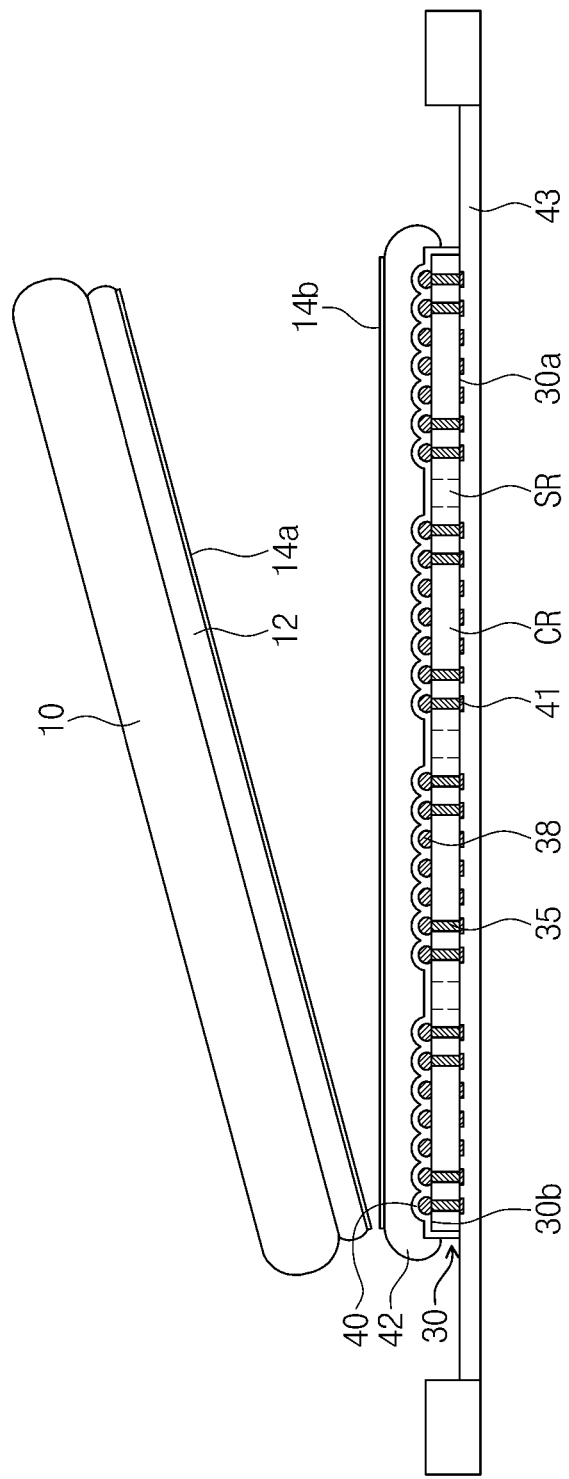
Figure 1M:
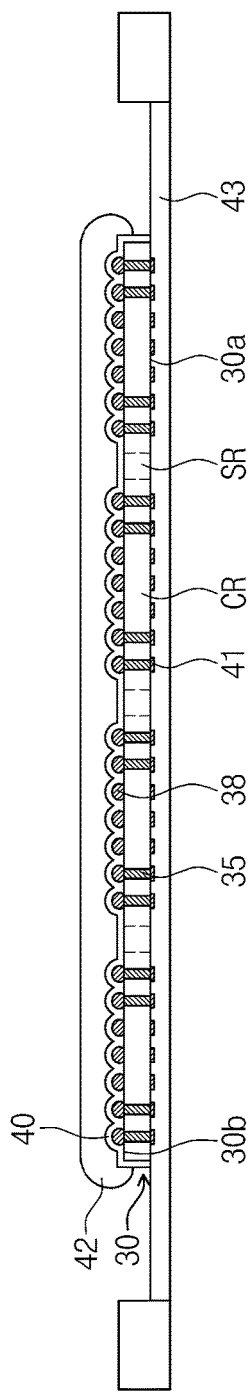
Figure 1N:
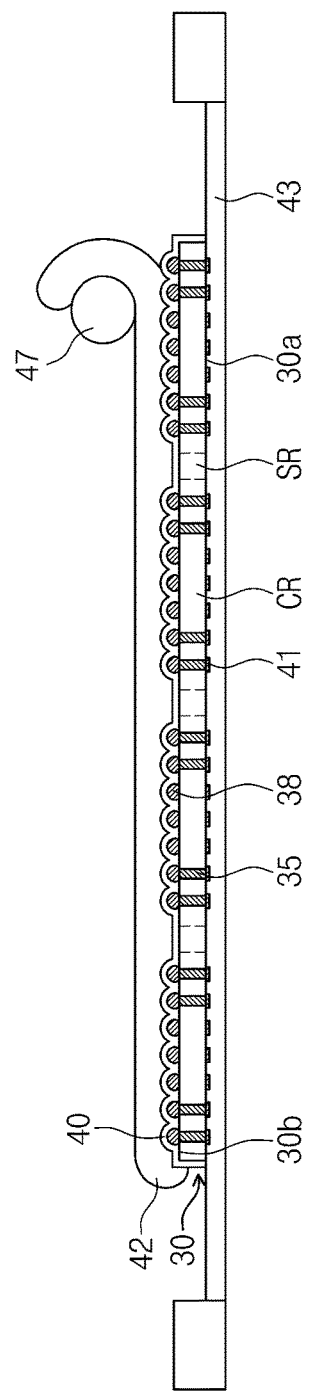
Figure 1O:
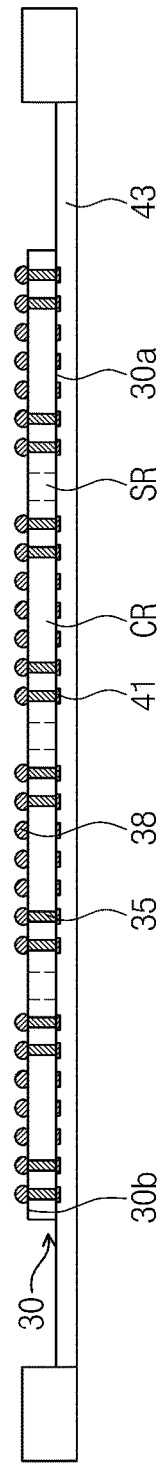
Figure 1P:
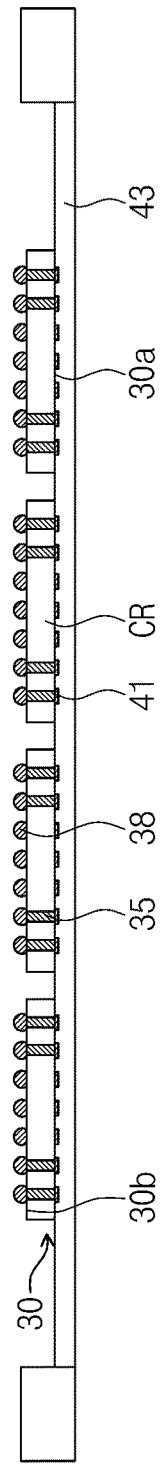
Figure 1Q:
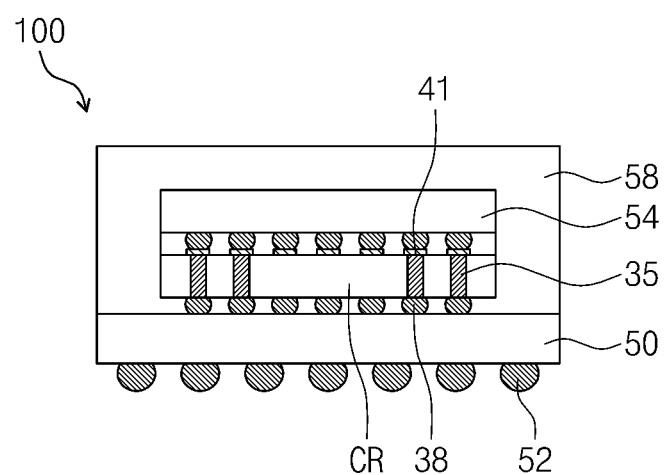

FIGS. 1A through 1Q are sectional views illustrating a method of fabricating a semiconductor device, according to example embodiments of the inventive concept.

Referring to FIG. 1A, a first substrate 10 may be prepared. The first substrate 10 may be used as a carrier. The first substrate 10 may be a silicon bare wafer, a glass substrate, and so forth. Hereinafter, the first substrate 10 may be called a carrier or a carrier wafer.

Referring to FIG. 1B, a first glue layer 12 may be formed on the first substrate 10. The first glue layer 12 may be formed of, for example, a thermosetting resin or a thermoplastic resin. After curing, the thermosetting resin may not exhibit a soft property, even when heat is applied thereto. The formation of the first glue layer 12 may include uniformly coating adhesive solution on the first substrate 10, and then, heating and curing the adhesive solution. As the result of the curing, the first glue layer 12 may have a very stable surface, and this may lead to a difficulty in forming a subsequent release layer. To avoid this difficulty, a process may be performed to activate the surface of the first glue layer 12. The activation of the first glue layer 12 may include depositing a seed layer on the surface of the first glue layer 12 using, for example, a chemical vapor deposition (CVD) process. The seed composing the seed layer may be the same material as the first glue layer 12.

Referring to FIG. 1C, a first release layer 14 may be formed on the first glue layer 12. The first release layer 14 may be formed of a thermosetting resin. The first release layer 14 may be formed to have a content of cross-linking agent lower than that of the first glue layer 12. The first release layer 14 may include polymer chains extending along a specific direction, and thus, by exerting a force parallel to the specific direction, it is possible to produce a crack in the first release layer 14. The formation of the first release layer 14 may include coating release solution on the first glue layer 12. Since the first glue layer 12 has an activated surface, the release solution can be coated with good wettability. For example, the release solution may be coated to have a uniform thickness on the first glue layer 12. The release solution may contain precursors. Thereafter, the release solution may be cured to form the first release layer 14. To cure the release solution, chemical reactors may be deposited using, for example, a chemical vapor deposition (CVD) process. The chemical reactors may be reacted with the precursors to induce a curing reaction for forming the first release layer 14.

Referring to FIG. 1D, a second substrate 30 may be prepared. The second substrate 30 may be a device wafer, on which a plurality of semiconductor devices is integrated. The second substrate 30 may include a first surface 30a and a second surface 30b facing each other. The second substrate 30 may include a plurality of chip parts CR, scribe lane parts SR provided between the chip parts CR, and a bevel part ER disposed at an edge of the second substrate 30. The bevel part ER may have a top surface that is vertically separated from top surfaces of the chip parts CR. A plurality of semiconductor devices may be provided on the chip parts CR.

Figure 2A:
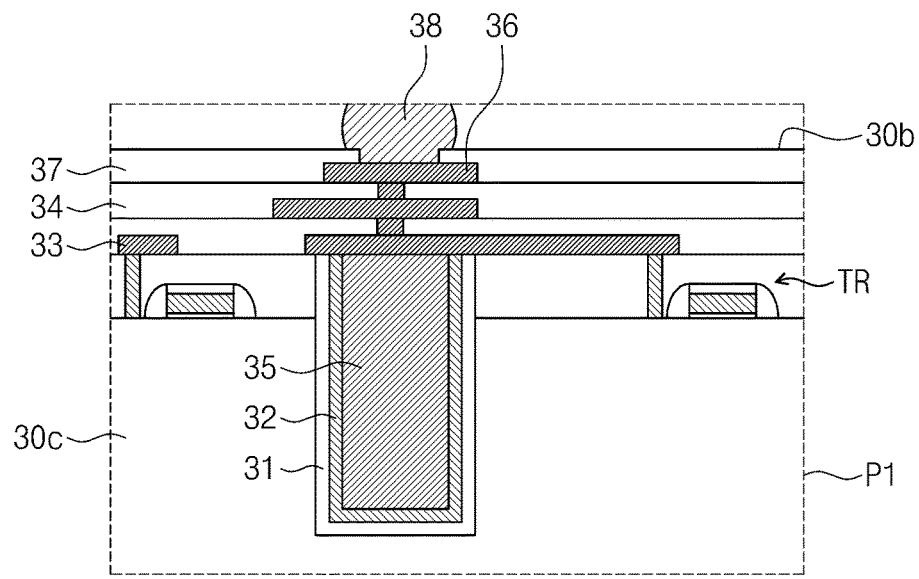
FIG. 2A is an enlarged view of a portion 'P1' of FIG. 1D.

FIG. 2A is an enlarged view of a portion 'P1' of FIG. 1D.

Referring to FIG. 2A, transistors TR may be provided on a substrate part 30c of the chip parts CR. The transistors TR may be covered with interlayered insulating layers 34. Interconnection lines 33 may be provided between the interlayered insulating layers 34. A through via 35 may be provided to partially penetrate the interlayered insulating layer 34 and the substrate part 30c and be connected to one of the interconnection lines 33 (for example, constituting a first metal layer). The through via 35 may be formed of a metallic material (e.g., copper). A diffusion barrier layer 32 and an insulating layer 31 may be conformally interposed between the through via 35 and the substrate part 30c and between the through via 35 and the interlayered insulating layer 34. A first conductive pad 36 may be provided on the interlayered insulating layer 34. A portion of the first conductive pad 36 and a portion of the interlayered insulating layer 34 may be covered with a first passivation layer 37. A first conductive bump 38 may be provided to penetrate the first passivation layer 37 and be in contact with the first conductive pad 36. The first conductive bump 38 may be formed of tin, lead, copper, and so forth. The first conductive bump 38 may include a solder ball.

As shown in FIG. 2A, the through via 35 may be in contact with one of the interconnection lines 33 constituting the first metal layer, but in certain embodiments, the through via 35 may be formed to be in contact with other layer of the interconnection lines 33 or to have a top surface coplanar with that of the substrate part 30c. Due to the presence of the first conductive bumps 38, the second surface 30b of the second substrate 30 may be uneven. In certain embodiments, the second surface 30b may be a top surface of the first passivation layer 37, and the first surface 30a may be a bottom surface of the substrate part 30c.

Referring to FIG. 1E, a second release layer 40 may be conformally formed on the second surface 30b of the second substrate 30. The second release layer 40 may be formed of a thermosetting resin layer. The second release layer 40 may be formed by the same process as that for forming the first release layer 14. The second release layer 40 may be formed to cover conformally the uneven surface caused by the first conductive bumps 38. Once the second release layer 40 of thermosetting resin is cured, material properties (e.g., shape) thereof may not be changed under a temperature condition applied for a conventional semiconductor fabricating process, and thus, it is possible to prevent the first conductive bumps 38 from being deformed in subsequent processes, such as a back-grinding process, a pad-forming process, and a mold process.

Referring to FIG. 1F, second adhesive solution 42a may be coated on the second release layer 40. The second adhesive solution 42a may include the same material as the first adhesive solution. The second adhesive solution 42a may include a thermosetting resin.

Referring to FIGS. 1G and 1H, on the second substrate 30, the first substrate 10 may be disposed in such a way that the first release layer 14 faces the second substrate 30. Thereafter, the first release layer 14 may be in contact with the second adhesive solution 42a. The second adhesive solution 42a may be heated and cured to form a second glue layer 42 that is robustly attached to the first release layer 14. Once the second glue layer 42 of thermosetting resin is cured, material properties (e.g., shape) thereof may not be changed under a temperature condition applied for a conventional semiconductor fabricating process, and thus, it is possible to prevent the first conductive bumps 38 from being deformed in subsequent processes, such as a back-grinding process, a pad-forming process, and a mold process. The first substrate 10 and the second substrate 30 may have Young's moduli that are substantially equivalent to that of silicon. The first substrate 10 and the second substrate 30 may have Young's modulus of about several to several hundreds of GPa. The glue layers 12 and 42 may have Young's moduli that are substantially equivalent to those of the release layers 14 and 40. The glue layers 12 and 42 and the release layers 14 and 40 may have Young's moduli that are smaller than those of the substrates 10 and 30. For example, the glue layers 12 and 42 and the release layers 14 and 40 may have Young's moduli of several to several hundreds of Mpa. An adhesive strength between the first and second glue layers 12 and 42 may be smaller than adhesive strengths between the first glue layer 12 and the first substrate 10 and between the second glue layer 42 and the second substrate 30.

Figure 2B:
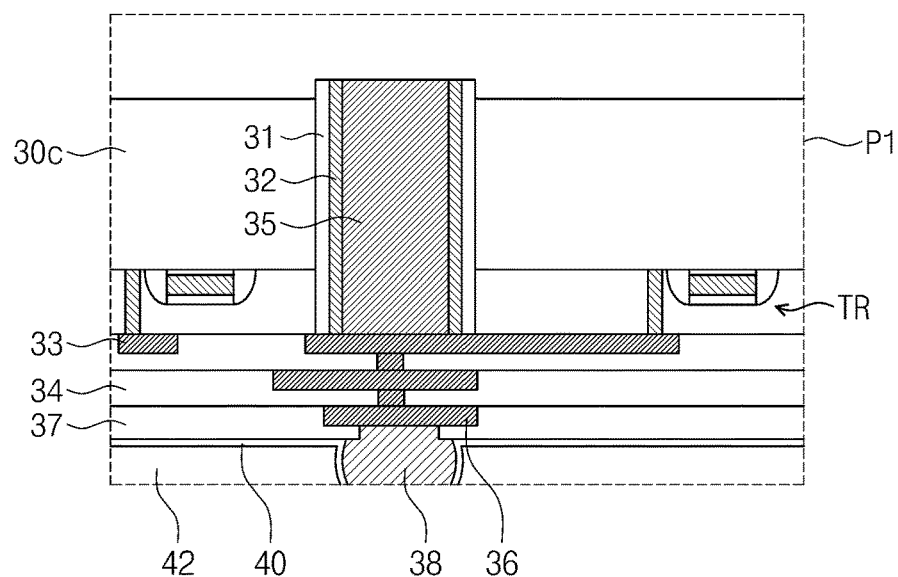
FIG. 2B is an enlarged view of a portion 'P1' of FIG. 1I.

FIG. 2B is an enlarged view of a portion 'P1' of FIG. 1I.

Referring to FIGS. 1I and 2B, a back-grinding process may be performed to remove a portion of the second substrate 30 adjacent to the first surface 30a in a specific depth. For example, the substrate part 30c may be partially removed to expose the through via 35. During the removal process, the bevel part ER may be removed. The substrate part 30c may be partially recessed by an etch-back process, and thus, a sidewall of the insulating layer 31 may be partially exposed.

Figure 2C:
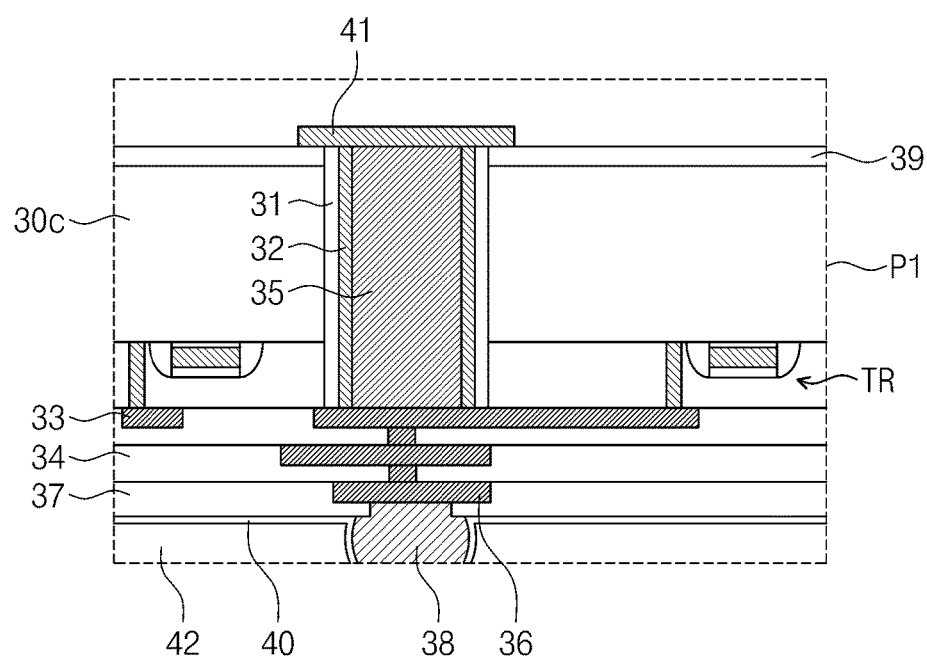
FIG. 2C is an enlarged view of a portion 'P1' of FIG. 1J.

FIG. 2C is an enlarged view of a portion 'P1' of FIG. 1J.

Referring to FIGS. 1J and 2C, a second passivation layer 39 may be formed on a recessed bottom surface of the substrate part 30c, and the, a second conductive pad 41 may be formed to be in contact with the through via 35. Although not shown, bumps or redistribution lines may be subsequently formed to be connected to the second conductive pad 41.

In certain embodiments, heat may be generated in or needed for the back-grinding process or the process of forming the second conductive pad 41. Since the release layers 14 and 40 and the glue layer 12 and 42 may be formed of thermosetting resin, they can be prevented from being physically deformed by such heat, and thus, the first substrate 10 may not be detached from the second substrate 30. Accordingly, it is possible to prevent a process failure.

After the back-grinding process or the pad-forming process, the second substrate 30 may be separated from the first substrate 10.

Referring to FIGS. 1K and 1L, the second substrate 30 attached with the first substrate 10 may be disposed on, for example, a chip attaching tape 43. Here, the second substrate 30 may be disposed in such a way that the first surface 30a is in contact with the chip attaching tape 43. Thereafter, a crack may be formed at one end portion of the first release layer 14 by a mechanical means 45, and then, an end portion of the first substrate 10 may be pulled up using a vacuum tool.

Figure 3:
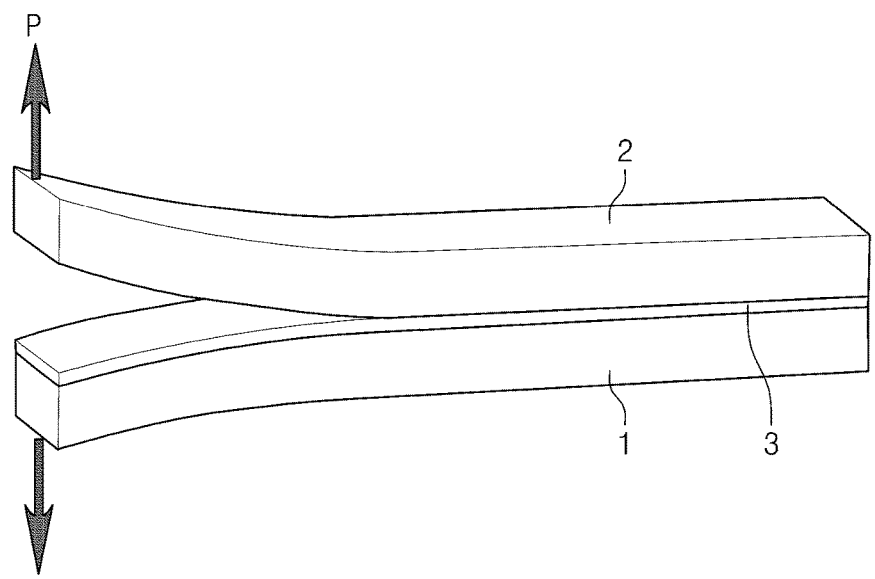
FIG. 3 is a perspective view illustrating a breakdown model of a double cantilever beam.

The process of detaching the first substrate 10 from the second substrate 30 may be described based on a double cantilever beam breakdown model shown in FIG. 3.

Referring to FIG. 3, a glue layer 3 may be interposed between two cantilever beams 1 and 2 to attach them. A force P for detaching the cantilever beams 1 and 2 from each other may be proportional to a square root of Young's modulus of the cantilever beams 1 and 2. In other words, if the cantilever beams 1 and 2 have large Young's moduli, it is more difficult to detach the cantilever beams 1 and 2 from each other.

If at least one of the first and second substrates 10 and 30 is in direct contact with the first release layer 14 without the glue layers 12 and 42, the detaching step may be hardly performed or, even when the detaching is finished, the second substrate 30 may be broken or damaged, because the first and second substrates 10 and 30 have very high Young's moduli of several to several hundreds of GPa. Further, since the second surface 30b of the second substrate 30 has the uneven surface caused by the first conductive bumps 38, the second substrate 30 and the second release layer 40 may have an increased contact area and form an interlocking structure, and this makes it difficult to perform the detaching process.

However, according to example embodiments of the inventive concept, as shown in FIGS. 1K and 1L, the first glue layer 12 may be interposed between the first substrate 10 and the first release layer 14, the second glue layer 42 may be interposed between the second substrate 30 and the first release layer 14, and the glue layers 12 and 42 may have relatively small Young's moduli of several to several hundreds of MPa, and thus, a force required for the detaching process can be decreased. Accordingly, it is possible to detach the first substrate 10 from the second substrate 30 with ease. Further, the release layers 14 and 40 may have contents of cross-linking agent that are lower than those of the glue layers 12 and 42 and be formed of polymer chains extending along a specific direction or path. As a result, plastic deformation can occur uniformly and crack can be continuously propagated. Accordingly, it is possible to detach more easily the first substrate 10 from the second substrate 30. In other words, the use of the method may make it possible to reduce a process failure and improve a fabrication yield. After the process of detaching the first substrate 10, a first remaining release layer 14a may remain on the first glue layer 12, and a second remaining release layer 14b may remain on the second glue layer 42.

The first glue layer 12 and the first remaining release layer 14a may be remove from the first substrate 10, and then, the first substrate 10 may be recycled. In the case where the first glue layer 12 is formed of thermoplastic resin, the removal of the first glue layer 12 may be performed more easily.

Alternatively, the removal of the first glue layer 12 and the first remaining release layer 14a may be omitted, before the recycling of the first substrate 10.

Referring to FIG. 1M, the second remaining release layer 14b may be removed from the second glue layer 42 using, for example, organic solvent to expose the surface of the second glue layer 42. The surface of the second glue layer 42 may be in stable state, as described in the process of forming the first glue layer 12. Accordingly, to activate the surface of the second glue layer 42, the surface of the second glue layer 42 may be treated using plasma of, for example, argon.

Referring to FIG. 1N, the second glue layer 42 may be removed using a roller 47 attached with a tape, thereby exposing the second release layer 40. The roller 47 may be attached to an end portion of the second glue layer 42 and be rolled to remove the second glue layer 42 from the second release layer 40. Here, in the case where the second glue layer 42 is in direct contact with the second substrate 30 without the second release layer 40, the second substrate 30 may be broken or damaged. However, according to example embodiments of the inventive concept, the second release layer 40 may protect the second substrate 30 against such problems.

Referring to FIG. 1O, the second release layer 40 may be removed by, for example, organic solvent, to expose the second substrate 30. Thereafter, the organic solvent may be removed or dried, for example, using nitrogen gas.

Referring to FIG. 1P, a sawing process may be performed to cut the scribe lane parts SR and separate the resulting structure into the chip parts CR.

Referring to FIG. 1Q, each of the separated chip parts CR may be mounted on a package substrate 50, for example, in a flip-chip bonding manner. Hereinafter, the chip part CR will be referred to as a first semiconductor chip CR. A second semiconductor chip 54 may be mounted on the first semiconductor chip CR, for example, in a flip-chip bonding manner. Thereafter, a mold process may be performed to form a mold layer 58 covering the first semiconductor chip CR and the second semiconductor chip 54. Outer solder balls 52 may be attached on a bottom surface of the package substrate 50, and as a result, a semiconductor package 100 may be formed.

Figure 4:
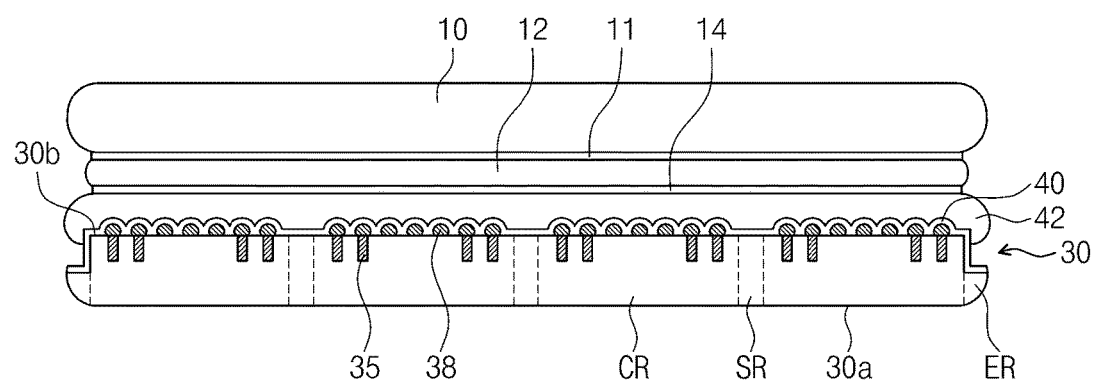
FIG. 4 is a sectional view illustrating a method of fabricating a semiconductor device, according to other example embodiments of the inventive concept.

FIG. 4 is a sectional view illustrating a method of fabricating a semiconductor device, according to other example embodiments of the inventive concept.

Referring to FIG. 4, an additional release layer 11 may be interposed between the first substrate 10 and the first glue layer 12. The additional release layer 11 may be formed using the same method as that for forming the release layers 14 and 40 and be formed of the same material as the release layers 14 and 40. The additional release layer 11 may be used to remove the first glue layer 12 more effectively or tidily from the first substrate 10.

FIGS. 5A through 5F are sectional views illustrating a method of fabricating a semiconductor device, according to still other example embodiments of the inventive concept.

Figure 5A:
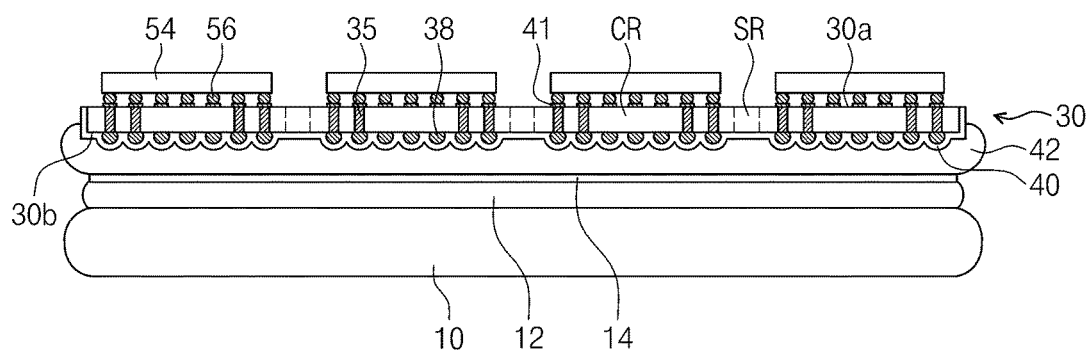
FIGS. 5A through 5F are sectional views illustrating a method of fabricating a semiconductor device, according to still other example embodiments of the inventive concept.

Referring to FIG. 5A, after the formation of the second conductive pad 41 as shown in FIG. 1J, the second semiconductor chips 54 may be mounted on the second substrate 30. The second semiconductor chips 54 may be disposed on the chip parts CR, respectively. The second semiconductor chip 54 may be connected to the second conductive pads 41 through second conductive bumps 56. The second semiconductor chip 54 may have a width smaller than that of the chip part CR.

Figure 5B:
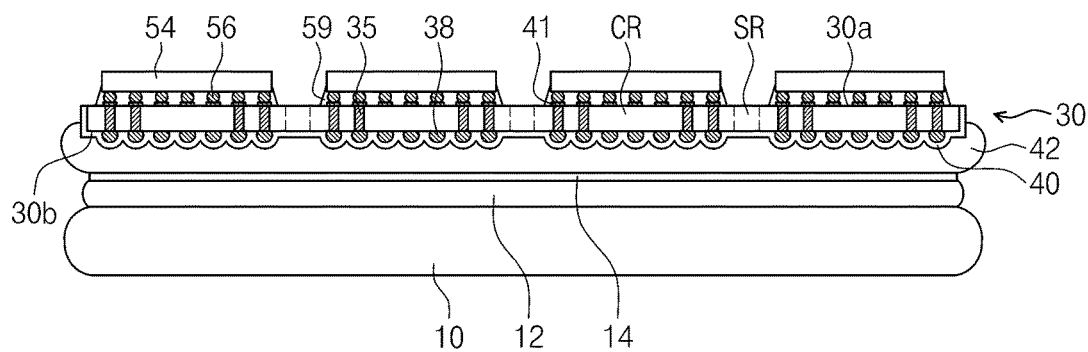

Referring to FIG. 5B, an under-fill resin layer 59 may be formed to fill a gap region between the second semiconductor chips 54 and the second substrate 30.

Figure 5C:
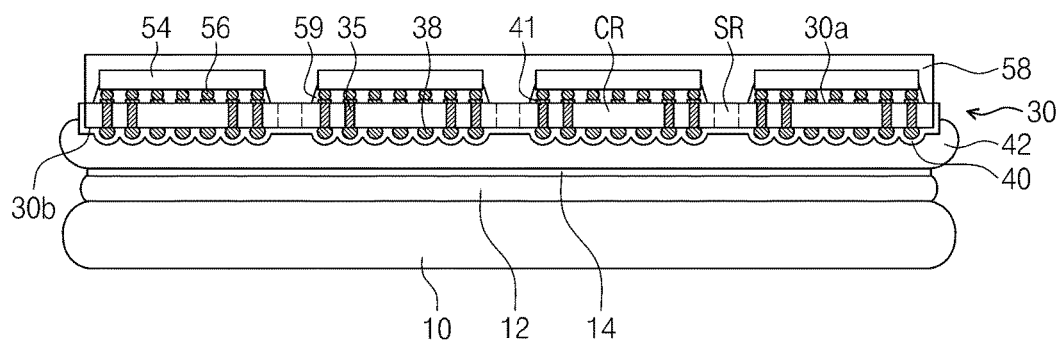

Referring to FIG. 5C, the mold layer 58 may be formed to cover the second semiconductor chips 54 and the second substrate 30. The mold layer 58 may correspond to a wafer-level mold layer. During the formation of the mold layer 58, the resulting structure may be heated to a temperature of about 180-200° C. Here, in the case where the second release layer 40 and the second glue layer 42 are formed of thermoplastic resin, the high temperature of 180-200° C. may lead to a change in material properties of the second release layer 40 and the second glue layer 42, and thus, the first conductive bump 38 may be deformed. For example, due to the high process temperature, the second release layer 40 and the second glue layer 42 may be liquefied and the first conductive bumps 38 may be melted, thereby causing a short circuit between adjacent ones of the first conductive bumps 38. However, according to example embodiments of the inventive concept, the second release layer 40 and the second glue layer 42 may be formed of thermosetting resin, and thus, material properties thereof can be prevented from being changed even under the high process temperature. Accordingly, it is possible to prevent the first conductive bumps 38 from being deformed.

Figure 5D:
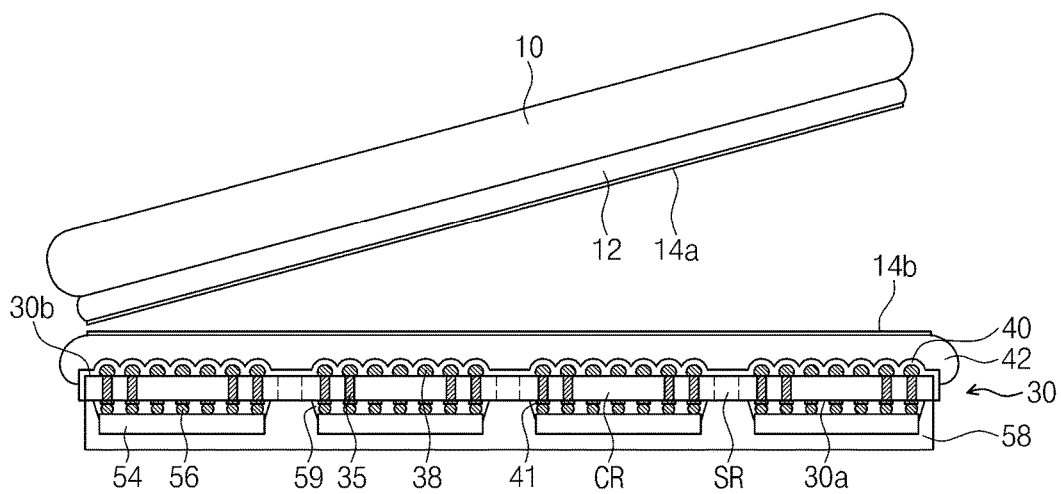

Referring to FIG. 5D, a crack may be formed at one end portion of the first release layer 14 using the mechanical means 45, and then, an end portion of the first substrate 10 may be pulled up using a vacuum tool, similar to the previous embodiments described with reference to FIGS. 1K and 1L. Accordingly, the first substrate 10 may be detached from the second substrate 30, and the first remaining release layer 14a may remain on the first glue layer 12 and the second remaining release layer 14b may remain on the second glue layer 42.

Figure 5E:
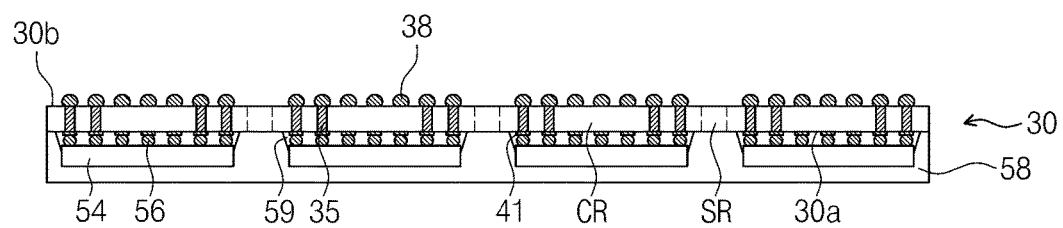

Referring to FIG. 5E, the second remaining release layer 14b, the second glue layer 42, and the second release layer 40 may be sequentially removed from the second substrate 30, similar to the previous embodiments described with reference to FIGS. 1M through 1O. Accordingly, the second substrate 30 may be exposed.

Figure 5F:
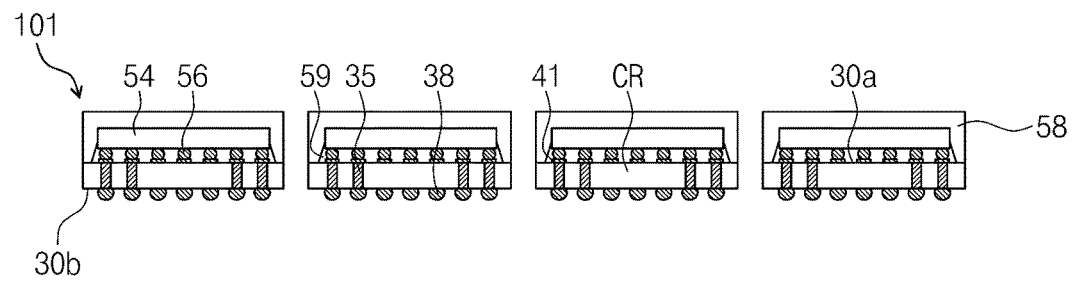

Referring to FIG. 5F, a singulation process may be performed to cut the scribe lane part SR and the mold layer 58 thereon and form a plurality of semiconductor packages 101 separated from each other. The semiconductor package 101 may correspond to a wafer-level package. In the semiconductor package 101, the second semiconductor chip 54 may be mounted on the first semiconductor chip CR serving as the chip part CR, and the mold layer 58 may be formed to cover the resulting structure. The first conductive bump 38 may be used as external paths for transmitting signals from or to the semiconductor package 101.

Figure 6A:
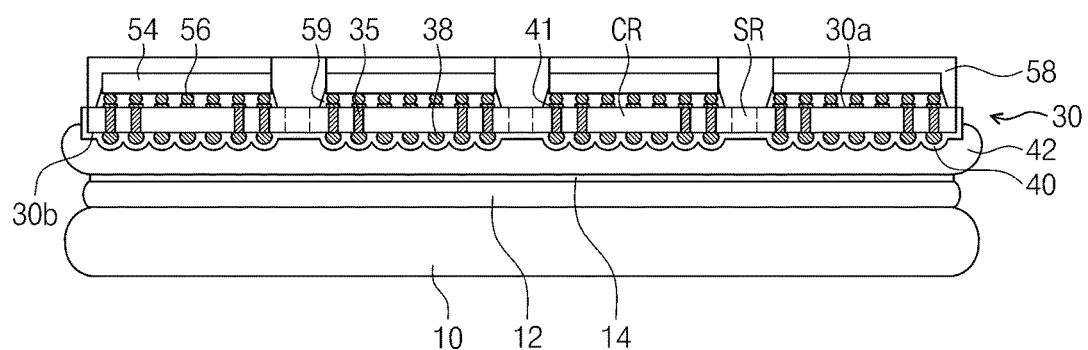
FIGS. 6A and 6B are sectional views illustrating a method of fabricating a semiconductor device, according to even other example embodiments of the inventive concept.
Figure 6B:
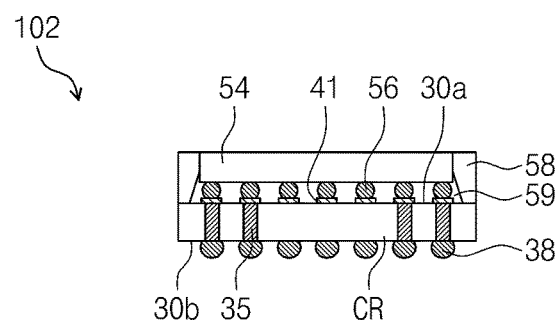

FIGS. 6A and 6B are sectional views illustrating a method of fabricating a semiconductor device, according to even other example embodiments of the inventive concept.

Referring to FIG. 6A, a grinding and polishing process may be performed to the wafer-level mold layer 58 of FIG. 5C to remove a portion of the mold layer 58 and expose the top surface of the second semiconductor chip 54. Here, the second semiconductor chip 54 may be partially removed to have a reduced thickness. Thereafter, the first substrate 10 may be removed, and then, the second glue layer 42 and the second release layer 40 may be sequentially removed, similar to the previous embodiments described with reference to FIG. 5D.

Referring to FIG. 6B, a singulation process may be performed to cut the scribe lane part SR and the mold layer 58 thereon and form a plurality of semiconductor packages 102 separated from each other.

Figure 7:
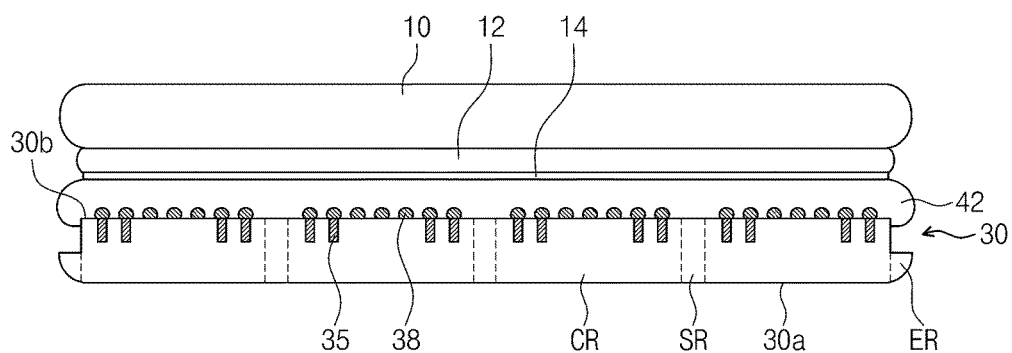
FIG. 7 is a sectional view illustrating a method of fabricating a semiconductor device, according to yet other example embodiments of the inventive concept.

FIG. 7 is a sectional view illustrating a method of fabricating a semiconductor device, according to yet other example embodiments of the inventive concept.

Referring to FIG. 7, according to the present embodiments, the second substrate 30 may not be covered with the second release layer 40, unlike that of FIG. 1H, and be in direct contact with the second glue layer 42. Other processes may be performed similar to the previous embodiments described with reference to FIGS. 1A through 1Q.

FIGS. 8A through 8E are sectional views illustrating a method of fabricating a semiconductor device, according to further example embodiments of the inventive concept. FIG. 9 is an enlarged view of a portion 'P2' of FIG. 8A.

Figure 8A:
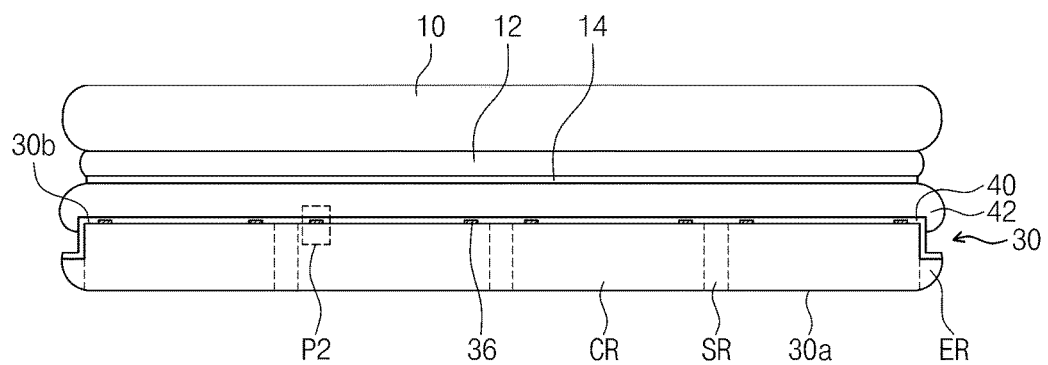
FIGS. 8A through 8E are sectional views illustrating a method of fabricating a semiconductor device, according to further example embodiments of the inventive concept.
Figure 9:
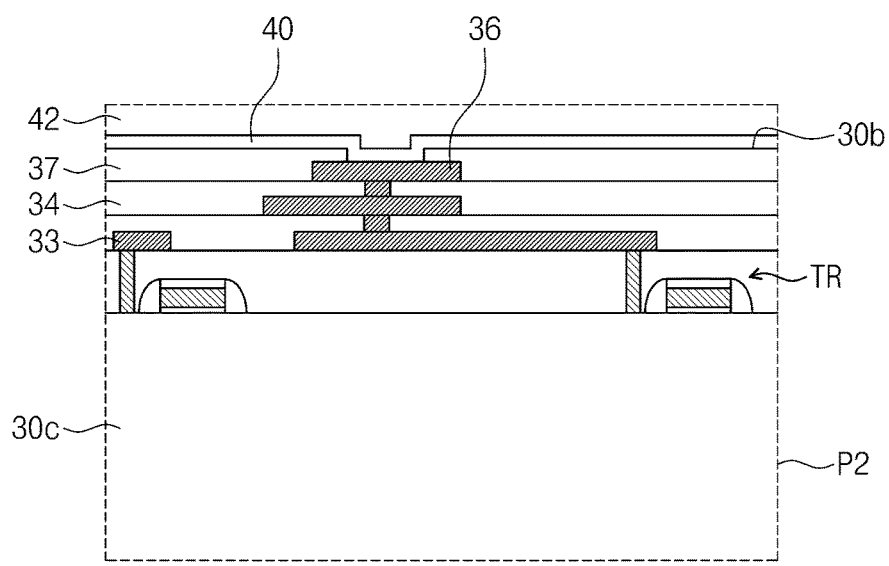
FIG. 9 is an enlarged view of a portion 'P2' of FIG. 8A.

Referring to FIGS. 8A and 9, according to the present embodiments, the second substrate 30 may not include the through via 35, the diffusion barrier layer 32, the insulating layer 31, and the first conductive bump 38 of FIG. 2A. Accordingly, the second surface 30b of the second substrate 30 may be relatively flat. Thereafter, the second release layer 40, the second glue layer 42, the first release layer 14, and the first glue layer 12 may be provided on the second substrate 30 to attach the first substrate 10 on the second substrate 30, similar to the previous embodiments described with reference to FIGS. 1A through 1H.

Figure 8B:
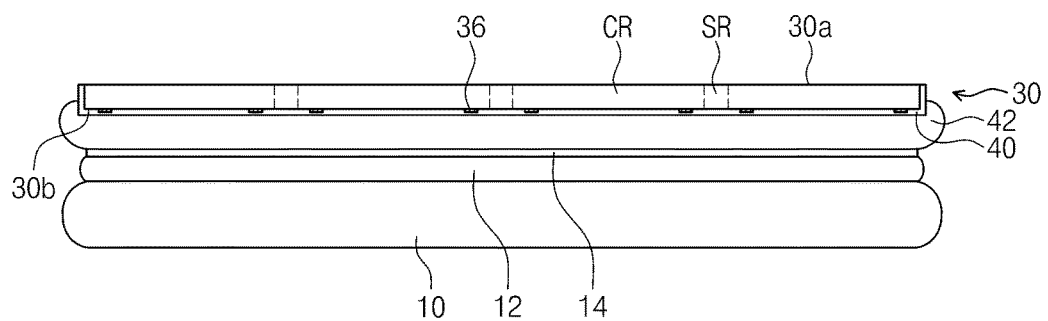

Referring to FIG. 8B, a portion of the second substrate 30 adjacent to the first surface 30a may be removed using a back-grinding process, similar to the previous embodiments. As a result, the second substrate 30 may have a reduced thickness. For a back-side illumination image sensor, this makes it possible to reduce a propagation length of light.

Alternatively, even if not the image sensor, this makes it possible to reduce a thickness of a semiconductor chip and thereby take advantage of the trend of small-size semiconductor device. According to the present embodiments, since the second substrate 30 does not include through via 35, any through via 35 may not be exposed by the back-grinding process.

Figure 8C:
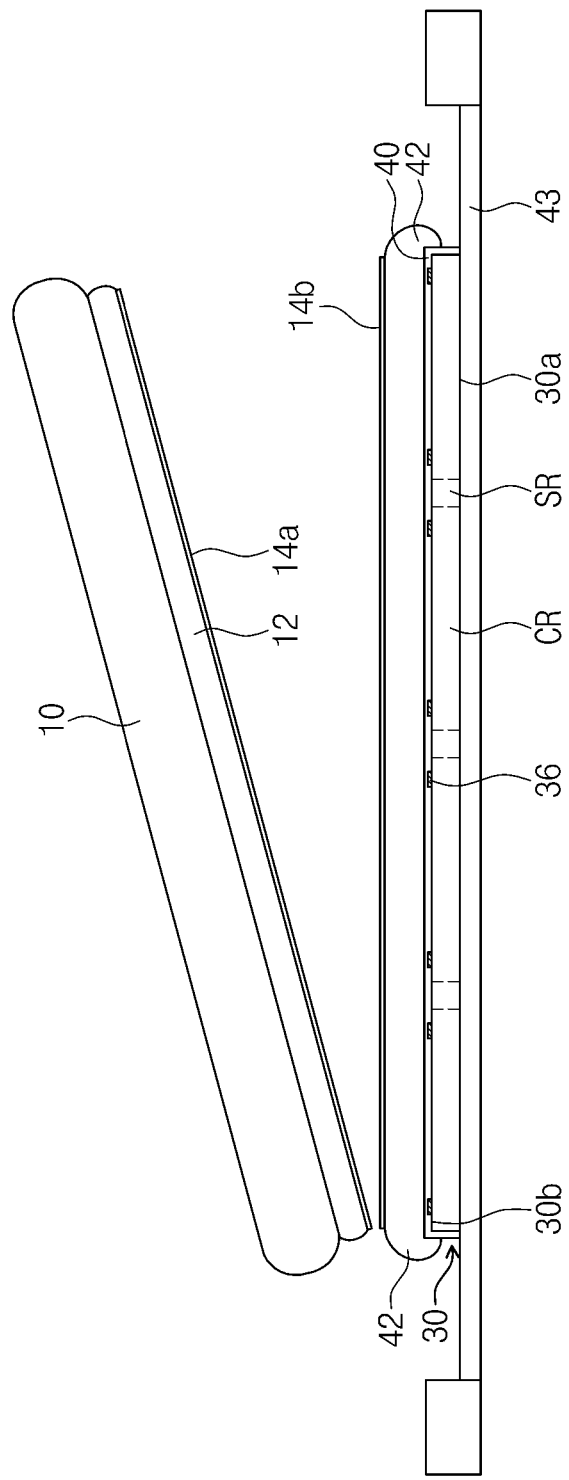

Referring to FIG. 8C, a crack may be formed at one end portion of the first release layer 14 using the mechanical means 45, and then, an end portion of the first substrate 10 may be pulled up using a vacuum tool, similar to the previous embodiments described with reference to FIGS. 1K and 1L. Accordingly, the first substrate 10 may be detached from the second substrate 30, the first remaining release layer 14*a* may remain on the first glue layer 12, and the second remaining release layer 14*b* may remain on the second glue layer 42.

Figure 8D:
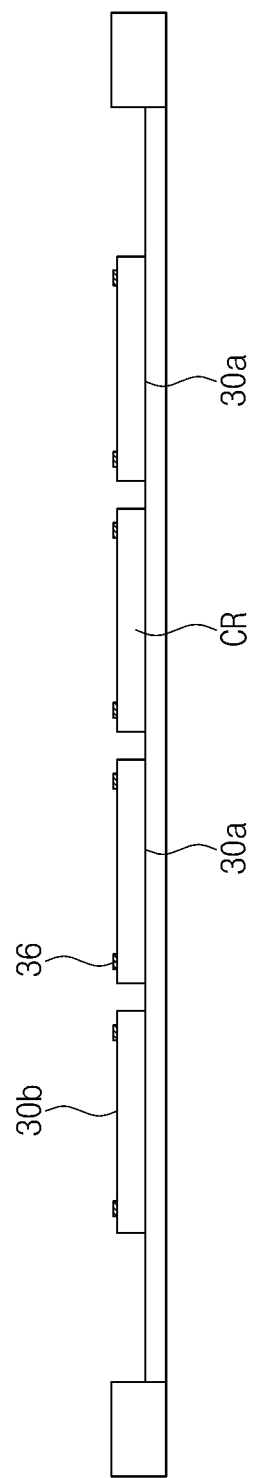

Referring to FIG. 8D, the second remaining release layer 14*b*, the second glue layer 42, and the second release layer 40 may be sequentially removed from the second substrate 30, similar to the previous embodiments described with reference to FIGS. 1M through 1O. Accordingly, the second substrate 30 may be exposed. A sawing process may be performed to cut the scribe lane part SR and separate the chip parts CR from each other.

Figure 8E:
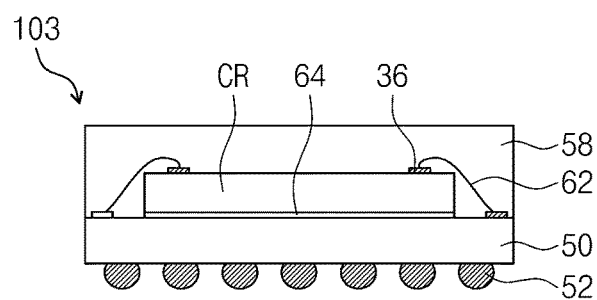

Referring to FIG. 8E, each of the separated chip parts CR may be attached on the package substrate 50 using, for example, an additional glue layer 64. Hereinafter, the chip part CR may be referred to as a semiconductor chip CR. The first conductive pad 36 may be electrically connected to the package substrate 50 using a wire 62. A mold process may be performed to form the mold layer 58 covering the semiconductor chip CR. Thereafter, the outer solder balls 52 may be attached on the bottom surface of the package substrate 50, and as a result, a semiconductor package 103 may be formed.

The afore-described semiconductor package technologies may be applied to various types of semiconductor devices and package modules including the same.

Figure 10:
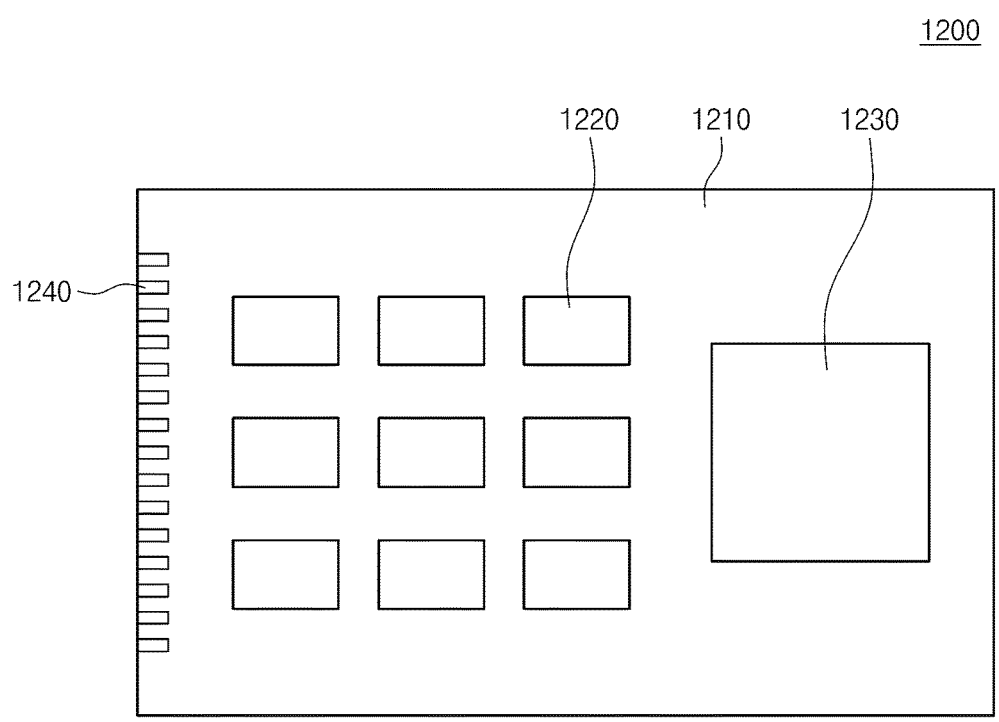
FIG. 10 is a diagram illustrating an example of package modules including a semiconductor package according to example embodiments of the inventive concept.

FIG. 10 is a diagram illustrating an example of package modules including a semiconductor package according to example embodiments of the inventive concept. Referring to FIG. 10, a package module 1200 may include semiconductor IC chips 1220 and a quad flat package (QFP) type semiconductor IC chip 1230 mounted on a package substrate 1210. At least one of the semiconductor IC chips 1220 and 1230 may include the semiconductor package according to example embodiments of the inventive concept. The package module 1200 may be connected to an external electronic device through an external connection terminal 1240 disposed at one side of the package substrate 1210.

Figure 11:
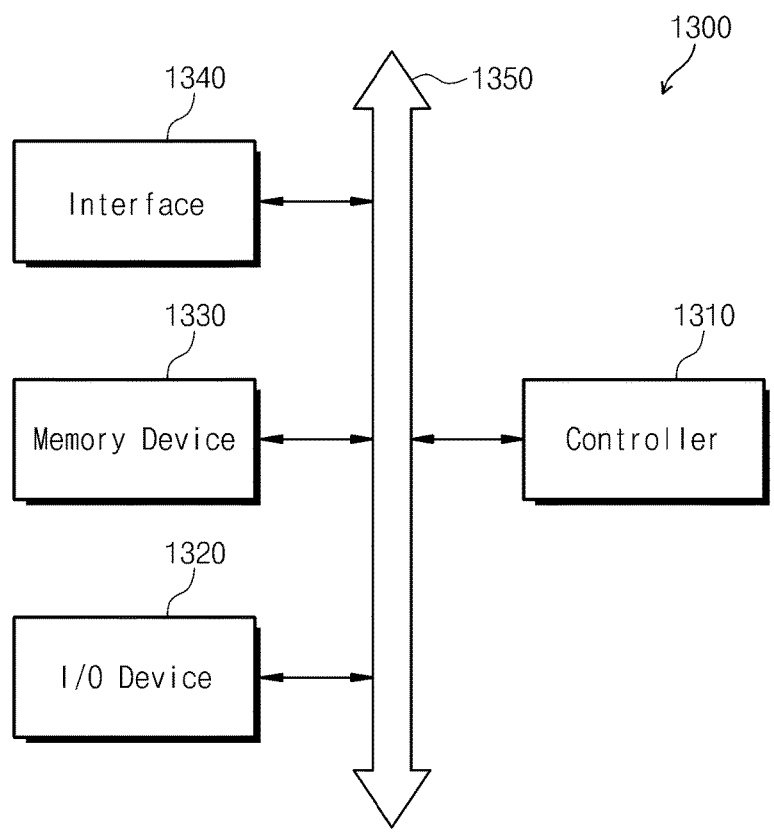
FIG. 11 is a block diagram illustrating an example of electronic systems including a semiconductor package according to example embodiments of the inventive concept.

The afore-described semiconductor package technologies may be applied to an electronic system. FIG. 11 is a block diagram illustrating an example of electronic systems including a semiconductor package according to example embodiments of the inventive concept. Referring to FIG. 11, an electronic system 1300 may include a controller 1310, an input/output (I/O) unit 1320, and a memory device 1330. The controller 1310, the I/O unit 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The controller 1310 and the memory device 1330 may include the semiconductor package according to example embodiments of the inventive concept. The I/O unit 1320 may include a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, an application chipset and/or a camera image processor (CIS) may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 12:
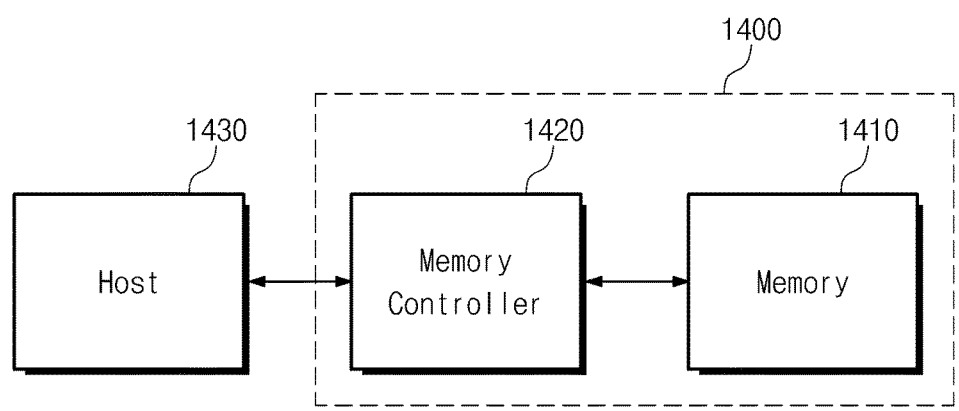
FIG. 12 is a block diagram illustrating an example of memory systems including a semiconductor package according to example embodiments of the inventive concept.

A semiconductor device, to which the afore-described semiconductor package technology is applied, may be provided in the form of a memory card. FIG. 12 is a block diagram illustrating an example of memory systems including a semiconductor package according to example embodiments of the inventive concept. Referring to FIG. 12, a memory system 1400 may include a non-volatile memory device 1410 and a memory controller 1420. The non-volatile memory device 1410 and the memory controller 1420 may store data or read stored data. The non-volatile memory device 1410 may be provided in the form of the semiconductor package according to example embodiments of the inventive concept. The memory controller 1420 may control the non-volatile memory device 1410 in order to read the stored data and/or to store data in response to read/write request of a host 1430.

While example embodiments of the inventive concepts have been particularly shown and described, it will be understood by one of ordinary skill in the art that variations in form and detail may be made therein without departing from the spirit and scope of the attached claims.

INDUSTRIAL APPLICABILITY

Example embodiments of the inventive concept may be applied to realize semiconductor devices.

The invention claimed is:

1. A method of fabricating a semiconductor device, comprising:

sequentially forming a first glue layer and a first release layer on a first substrate;

sequentially forming a second release layer and a second glue layer on a second substrate;
attaching the first substrate to the second substrate in such a way that the first release layer is in contact with the second glue layer;
performing a back-grinding process to reduce a thickness of the second substrate;
forming a conductive pad on the second substrate; and
detaching the first substrate from the second substrate resulting in the second substrate having the second glue layer and second release layer remaining thereon and resulting in the first substrate having the first glue layer remaining thereon.

2. The method of claim 1, further comprising forming an additional release layer on the first substrate, before the forming of the first glue layer and the first release layer.

3. The method of claim 1, further comprising cracking the first release layer to detach the first substrate from the second substrate.

4. The method of claim 3, further comprising sawing the second substrate to form semiconductor chips separated from each other.

5. The method of claim 4, further comprising:
mounting a first semiconductor chip of the semiconductor chips on a package substrate;
forming a mold layer to cover the first semiconductor chip; and
attaching outer solder balls onto a bottom surface of the package substrate.

6. The method of claim 3,
wherein cracking the first release layer to detach the first substrate from the second substrate results in the second substrate having the second glue layer and second release layer remaining thereon, and
wherein the method further comprises detaching the second glue layer from the second release layer and second substrate.

7. The method of claim 6, wherein the second glue layer is formed directly on the second release layer after the second release layer is formed on the second substrate.

8. The method of claim 1, further comprising:
mounting first semiconductor chips spaced apart from each other, on the second substrate, each of the first semiconductor chips being in contact with the conductive pad;
forming a mold layer on the second substrate to cover the first semiconductor chips;
cracking the first release layer to detach the first substrate from the second substrate; and
performing a singulation process to cut the mold layer and a portion of the second substrate along regions between the first semiconductor chips, thereby forming semiconductor packages, each of which includes a corresponding one of the first semiconductor chips, a second semiconductor chip provided below the corresponding one of the first semiconductor chips, and a mold layer covering the corresponding one of the first semiconductor chips.

9. The method of claim 8, further comprising, before the detaching of the first substrate, performing a grinding process to remove a portion of the mold layer.

10. The method of claim 1, wherein the second substrate comprises a through via, and the back-grinding process is performed to expose the through via.

11. The method of claim 1, wherein the first and second glue layers and the first and second release layers are formed of thermosetting resins.

12. The method of claim 11, wherein the first and second release layers are formed to have a content of cross-linking agent that is lower than that of the first and second glue layers.

13. The method of claim 11, wherein the first and second glue layers and the first and second release layers are formed to have Young's moduli that are lower than those of the first and second substrates.

14. The method of claim 1, wherein the first glue layer is a thermoplastic resin layer, and the second glue layer and the first and second release layers are thermosetting resin layers.

15. The method of claim 1, wherein the second substrate further comprises a plurality of conductive bumps provided on a top surface thereof to be in contact with the second release layer.

16. A method of fabricating a semiconductor device, comprising:
sequentially forming a first glue layer and a first release layer on a first substrate;
sequentially forming a second release layer and a second glue layer on a second substrate;
attaching the first substrate to the second substrate in such a way that the first release layer is in contact with the second glue layer; and
performing a back-grinding process to reduce a thickness of the second substrate;
forming a conductive pad on the second substrate,
wherein an adhesive strength between the first glue layer and the second glue layer is lower than adhesive strengths between the first glue layer and the first substrate and between the second glue layer and the second substrate.

17. A method of fabricating a semiconductor device, comprising:
attaching a first substrate to a second substrate using a first glue layer, a first release layer, and a second glue layer that are sequentially interposed between the first and second substrates; and
cracking the first release layer to detach the first substrate from the second substrate,
wherein the method further comprises forming a second release layer between the second glue layer and the second substrate, and
wherein the first release layer, the second glue layer, and the second release layer contain thermosetting resin.

18. The method of claim 17, wherein the second substrate comprises chip parts and scribe lane parts therebetween, and the method further comprises cutting the scribe lane parts to separate the chip parts from each other.

19. The method of claim 17,
wherein cracking the first release layer to detach the first substrate from the second substrate results in the second substrate having the second glue layer and second release layer remaining thereon, and
wherein the method further comprises detaching the second glue layer from the second release layer and second substrate.

* * * * *